United States Patent [19]

Frederick et al.

[11] 4,436,577

[45] Mar. 13, 1984

[54] METHOD OF REGULATING CONCENTRATION AND DISTRIBUTION OF OXYGEN IN CZOCHRALSKI GROWN SILICON

[75] Inventors: Roger A. Frederick, St. Louis County; Jerry W. Moody, St. Charles, both of Mo.

[73] Assignee: Monsanto Company, St. Louis, Mo.

[21] Appl. No.: 406,643

[22] Filed: Aug. 9, 1982

Related U.S. Application Data

[63] Continuation-in-part of Ser. No. 220,924, Dec. 24, 1980, abandoned.

[51] Int. Cl.³ .............................................. C30B 15/00
[52] U.S. Cl. ............................................... 156/617 SP
[58] Field of Search ................. 156/617 SP, 618, 601, 156/DIG. 64; 422/246, 249

[56] References Cited

U.S. PATENT DOCUMENTS

3,929,557 12/1975 Goodrum ............................ 156/618
4,010,064  3/1977 Patrick ................................ 156/618
4,040,895  8/1977 Patrick et al. ....................... 156/618
4,239,585 12/1980 Kohl ............................ 156/617 SP

*Primary Examiner*—Hiram H. Bernstein
*Attorney, Agent, or Firm*—P. L. Passley; R. R. Jones; A. H. Cole

[57] ABSTRACT

Oxygen concentration and distribution within silicon crystal rods drawn according to the Czochralski process from silicon melt contained in a silica crucible, are regulated through variation of both the magnitude and relative sense of direction of seed and crucible rotation rates with uniform distribution of the oxygen being accomplished by increasing crucible rotation rate to preselected values as a function of crystal rod growth and melt consumption.

8 Claims, 7 Drawing Figures

METHOD OF REGULATING CONCENTRATION AND DISTRIBUTION OF OXYGEN IN CZOCHRALSKI GROWN SILICON

CROSS REFERENCE TO RELATED APPLICATIONS

This application is a continuation-in-part of copending application Ser. No. 220,924, filed Dec. 24, 1980 now abandoned.

BACKGROUND OF THE INVENTION

This invention relates to a method for regulating concentration and distribution of oxygen in Czochralski drawn silicon crystal rods through variation of both the magnitude and relative sense of direction of seed and crucible rotation rates. In another aspect, the invention relates to a method for achieving uniform axial and radial distribution of oxygen in Czochralski grown silicon rods through increasing crucible rotation rate to pre-selected values as a function of cyrstal rod growth and melt consumption while rotating the crystal in a direction opposite to that of the crucible and at a rate higher than that of the crucible. In yet another aspect, the invention relates to a method for introducing various levels of oxygen into the Czochralski grown silicon rod through choice of initial rotation magnitude and direction of the seed and crucible.

The production of single crystals from materials such as silicon plays an important role in semiconductor technologies. A suitable method for growing the silicon crystals is known as the Czochralski technique in which a seed crystal, which has the desired crystal orientation, is introduced to a melt of silicon. The silicon melt can also contain certain dopants which are introduced for the purpose of modifying the electrical characteristics of the silicon as is known in the art. The melt is contained in a silica crucible or vessel which is heated so that the silicon melt is at, or slightly above, its melting point. The seed crystal is slowly withdrawn from the melt, in an inert atmosphere such as argon, and the silicon solidifies on the seed to produce the growth of a crystal rod. Generally, the Czochralski technique is utilized for producing single silicon crystal which is utilized by the electronics industry. A cylindrical crystal is produced by rotating the crystal at a constant rate as it is drawn. The crucible is conventionally rotated at a constant rate in the opposite direction for the purposes of assuring thermal symmetry in the growth environment. The withdrawing rate and power to the heating means is first adjusted to cause a neck down of the crystal. This eliminates dislocations caused by the thermal shock which occurs when the seed crystal initially contacts the melt. The withdrawing rate and the power is then adjusted to cause the diameter of the crystal to increase in a cone shaped manner until the desired crystal diameter is reached. The withdrawal rate and heating are then adjusted so as to maintain constant diameter until the process approaches an ending where again the rate and heating are increased so that the diameter decreases to form a cone portion at the end of the Czochralski rod.

In general, commercial methods using the Czochralski techniques are limited because of the amount of melt present in the crucible in the size and volume of the drawn silicon crystal.

At the melt temperature of silicon (about 1420° C.), the surface of the silica ($SiO_2$) crucible which is in contact with the melt dissolves. Some part of the dissolved silica evaporates from the surface of the melt as SiO (silicon monoxide). Another part of dissolved silica is incorporated into the growing crystal. The rest of the dissolved silica is retained in the molten silicon. Thus, the silica crucible which is used to contain the silicon melt is the source of oxygen which is found in silicon crystals grown by the conventional Czochralski technique.

Figure 1:
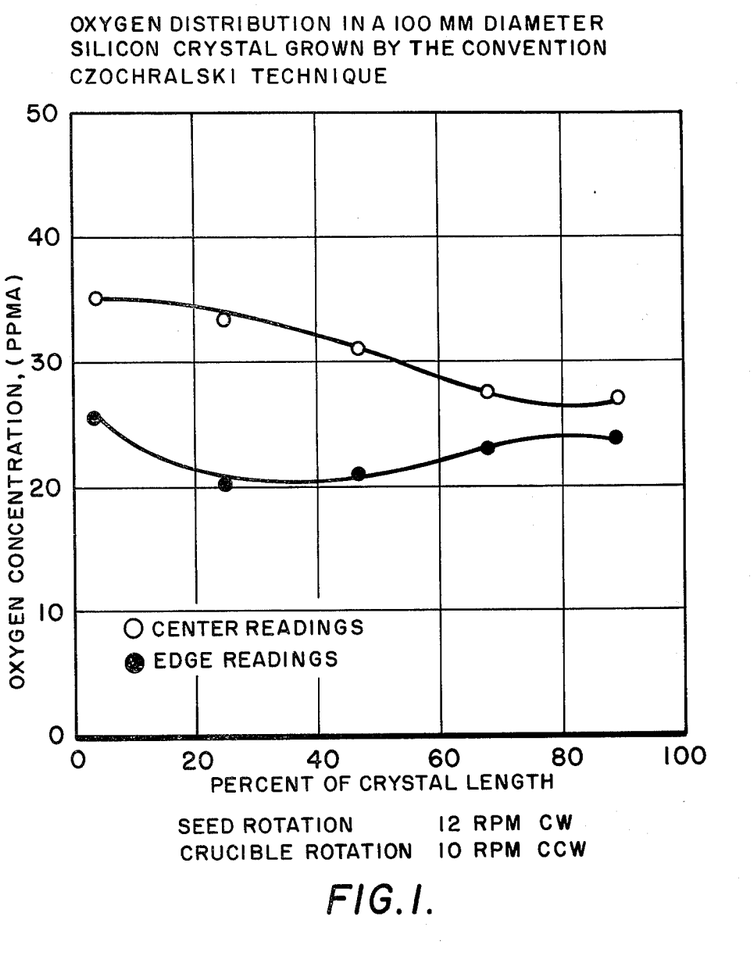

Silicon crystals grown from melts contained in silica crucibles generally have a concentration of oxygen of about 10 to 50 parts per million atomic (ppma) as measured by ASTM standard F-121. The oxygen concentration in silicon crystals grown under Czochralski conditions prevalent in the industry today is not uniform but varies along the length of the crystal, for example, being higher at the seed end than in the middle and/or bottom or tang end of the crystal. In addition, there is a variation in oxygen concentration along the radius of a cross-sectional slice of the crystal. The non-uniform distribution of oxygen in silicon crystals grown by the conventional Czochralski technique using constant seed and crucible rotation rates is illustrated by the data in FIG. 1. FIG. 1 is a plot of the oxygen concentration measured at the center and edge of cross-sectional samples taken along the length of a 100 mm diameter silicon crystal. The non-uniform distribution of oxygen in this crystal is obvious. The oxygen concentration at the center of the crystal ranged from over 35 ppma at the seed end to less than 27 ppma near the tang end and a radical (center to edge) variation of over 13 ppma was found in parts of the crystal. Although these data pertain to a particular crystal, it is typical of crystals of other diameters grown under similar conditions.

Although oxygen in Czochralski grown silicon has long been regarded as a more or less undesirable impurity until recently, its presence has not been of great concern because the oxygen can be rendered electrically inactive by proper heat treatment. However, oxygen does tend to precipitate from solid solution or react with other impurities or lattice defects to form microdefects when the crystal is subjected to the diffusion and heat-treatment processes typical of modern electronic technology. Such microdefects can be either beneficial or deleterious to solid-state electronic device yields depending on the concentration of oxygen and the processing steps to which the crystal (or wafer) is subjected. Thus, to increase device yields, it is becoming ever more desirable and necessary to grow silicon crystals having a specified oxygen content and uniform distribution.

Methods for enhancing the concentration of oxygen in Czochralski grown silicon crystals have been described in the patent and other literature wherein, for example, during the Czochralski process the crucible rotation is stopped and started periodically during the process to provide fluid shearing at the melt-crucible interface. In another art taught method, oxygen content of Czochralski produced silicon is enhanced by changing surface characteristics of the portion of the silica vessle which is in contact with the melt so as to provide an increased oxygen concentration in the melt during the crystal drawing process. In yet another approach, lower oxygen concentrations are attempted through lower initial crystal rotation rates followed by relatively slow acceleration of the crystal rotation rate during the Czochralski pull.

All of the above methods have been evaluated and found to be lacking in certain respects. The range of oxygen concentrations obtainable from a particular process appear to be limited and/or fail to produce the desired uniform radial distribution of the oxygen concentration. The present invention allows for axial control of oxygen in Czochralski produced silicon rods over a wide range of concentration (from about 15 ppma to greater than 40 ppma) and results in significantly improved uniform axial and radial distributions of the oxygen.

SUMMARY OF THE INVENTION

In accordance with this invention, a method is provided for regulating oxygen content and distribution of the oxygen content in silicon crystal rod drawn from the action of a seed crystal on a melt of silicon contained in a silica crucible. The regulating method according to the invention is achieved through variation of both the magnitude and relative sense of direction of seed and crucible rotation rates resulting in uniform distribution of the oxygen content as well as the level of oxygen content.

In one embodiment of the invention, the distribution within Czochralski grown silicon crystal seed rods is accomplished by rotating the crystal seed rod as drawn from the melt at a greater rate of rotation and in opposite direction to the rotation of the melt crucible rotation while increasing the crucible rotation rate as the crucible melt level diminishes, therein achieving regulation of the distribution of the oxygen content in the Czochralski grown silicon rod.

In another embodiment of the invention, oxygen concentration is regulated through initial Czochralski process seed and crucible rotation magnitude and relative direction while uniform distribution of the oxygen concentration is accomplished by increasing the crucible rotation rate while holding the seed rod rotation rate constant at a higher value of rotation than reached by the increasing crucible rotation rate.

In yet another embodiment of the invention, the benefits of oxygen concentration and distribution regulation is achieved through increasing the crucible rotation rates during Czochralski rod production and varying the seed rod rotation rates which are greater than the crucible rotation rates.

BRIEF DESCRIPTION OF THE DRAWINGS

The seven (7) drawings present figures illustrating various control of the Czochralski methods as well as the effects of variations of both magnitude and relative sense of direction of seed and crucible rotation rates wherein oxygen concentration ppma is plotted against the percent crystal length or percent frozen of the Czochralski rod. The drawings present results which are in accordance with the invention as well as art taught control methods for comparative purposes.

DETAILED DESCRIPTION

The foregoing and other objects, features, and advantages of the invention will be apparent from the following more particular description of the preferred embodiments of the invention.

As described above, a commonly used method for the growth of single crystals of semi-conductor materials such as silicon is the well known Czochralski method in which a charge of very pure silicon, from which the single crystal is to be drawn is placed in a silica crucible. Development and research investigations of the Czochralski methods and products produced by the Czochralski method have led to the understanding that the concentration of oxygen in Czochralski silicon melts results from a dynamical balance between the amount of oxygen dissolved from the crucible, the amount lost by evaporation from the melt surface and the amount incorporated into the growing crystal. At steady state this relationship may be expressed:

amount of oxygen in melt=rate of crucible dissolution−rate of SiO evaporation−rate of oxygen incorporation in crystal.

For a particular thermal configuration, the rate at which the crucible dissolves is proportional to the area of the crucible wall ($A_c$) which is in contact with the silicon melt while the rate of SiO evaporation is proportional to the free melt surface ($A_m$). The rate at which oxygen is incorporated into the growing crystal is proportional to the relative solubility of oxygen in solid and liquid silicon and the mass growth rate of the crystal. Therefore, it is expected that the amount of oxygen in the melt (and, hence, in the crystal) would depend on the ratio of $A_c$ to $A_m$. Since the area of the crucible wall in contact with the melt, $A_c$, decreases as the crystal grows and the melt depth decreases, it is to be expected that the concentration of oxygen in the crystal would decrease from the seed end as discussed above and as shown in FIG. 1.

Further research led to the discovery that the rate of crucible dissolution and, hence, the amount of oxygen incorporated in the crystal depends not only on the area of the crucible in contact with the melt, but also on the crucible rotation rate. The dependence of oxygen concentration on rotation rates is complicated and was found to be a function of both the magnitude and the relative sense of direction of the rotation rates. In general, for counter-rotations with the seed rotating faster than the crucible, oxygen concentration increases with crucible rotation rates. The oxygen concentration is reduced for isorotations or for counter-rotations with the crucible rotating faster than the crystal.

Figure 2:
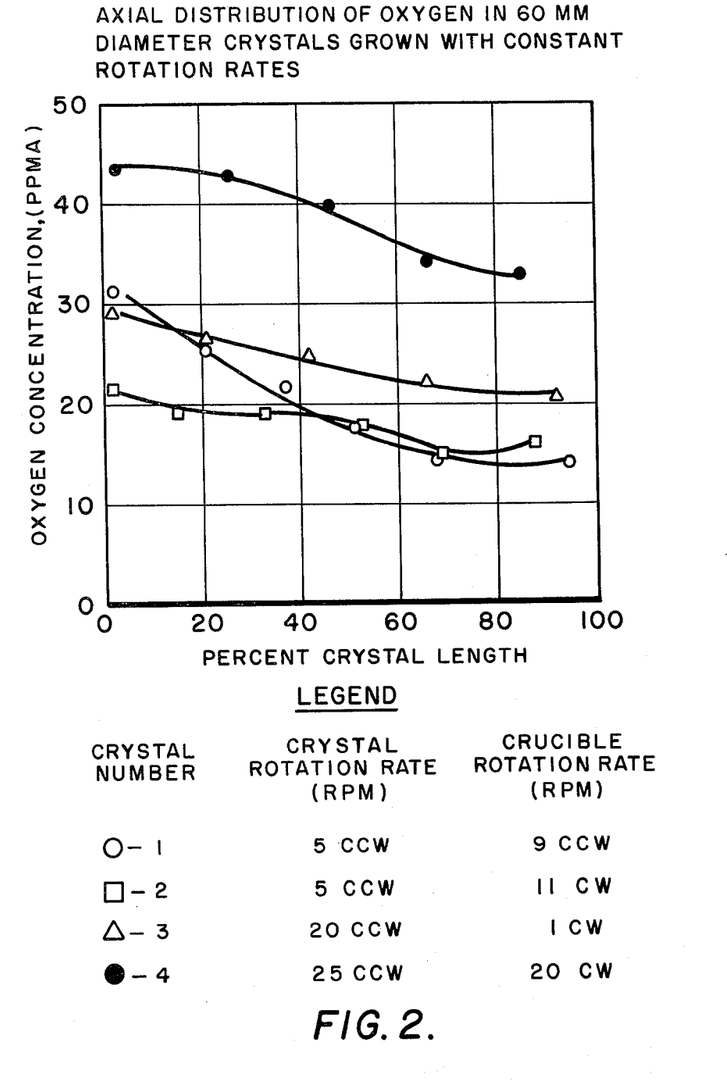

These effects are illustrated by the distribution curves shown in FIG. 2. In FIG. 2, crystal numbers 1 through 4 have crystal and crucible rotation rates in rpm's identified by CW (clock-wise) and CCW (counter clockwise) rotation. According to FIG. 2, crystal number 1 which is not in accordance with the invention illustrates a high seed end concentration of about 32 ppma while illustrating poor oxygen axial concentration gradient to tail oxygen concentration of about 14 ppma. The Czochralski process for producing crystal number 1 illustrates a crystal rotation rate of less than the crucible rotation rate and rotation in the same direction, such teachings being contrary to the processes according to the invention. None of the crystals of FIG. 2, for example, number 4 which is somewhat attuned to the methods used in commercial processes, provide uniform oxygen concentration distribution. Crystals 3 and 4 of FIG. 2 do illustrate that the higher the crucible rotation rate in the counterrotation mode, the higher the oxygen concentration.

Figure 3:
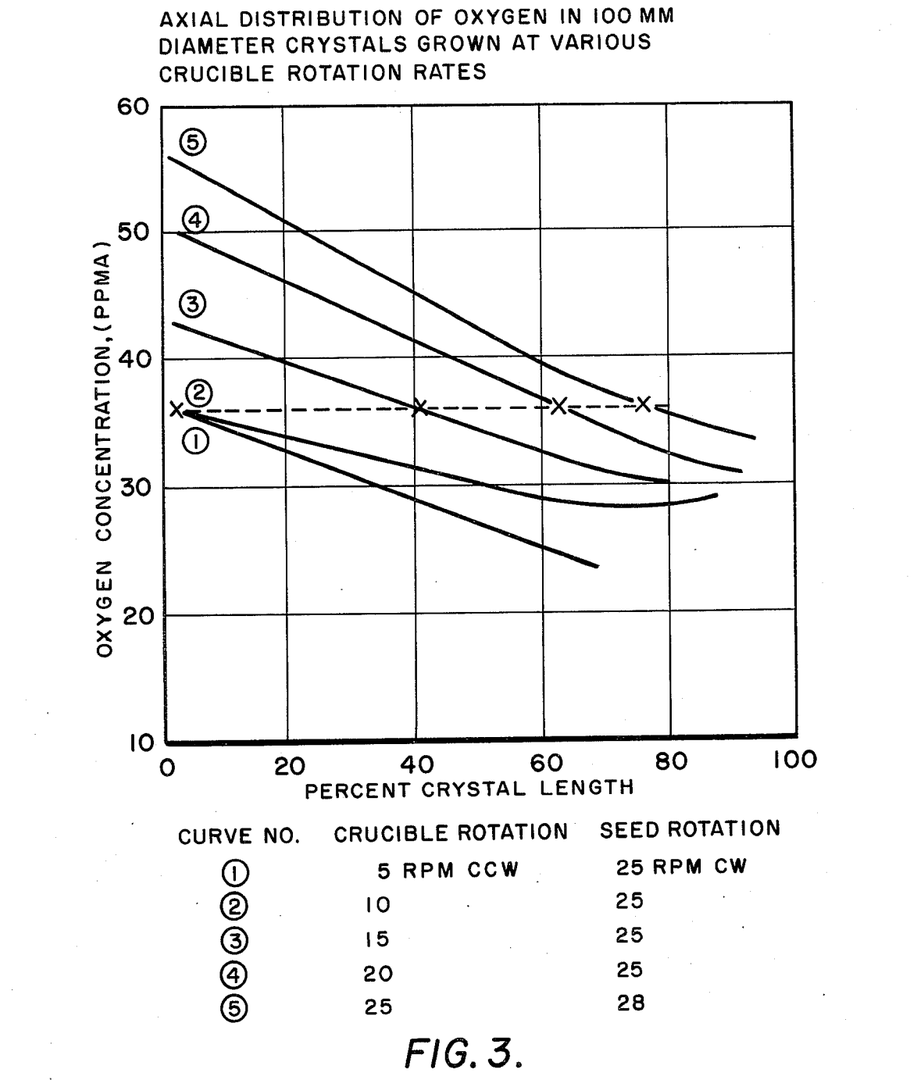

This effect is further illustrated by the data of FIG. 3. Here is shown the dependence of the axial distribution of oxygen in 100 mm diameter crystals on crucible rotation rate for a particular seed counter rotation rate which is higher than the crucible rotation rates used. We interpret the difference in the curves as being due to the effect of crucible rotation on the dissolution rate of the crucible—the higher the rotation rate, the higher the dissolution rate.

Figure 4:
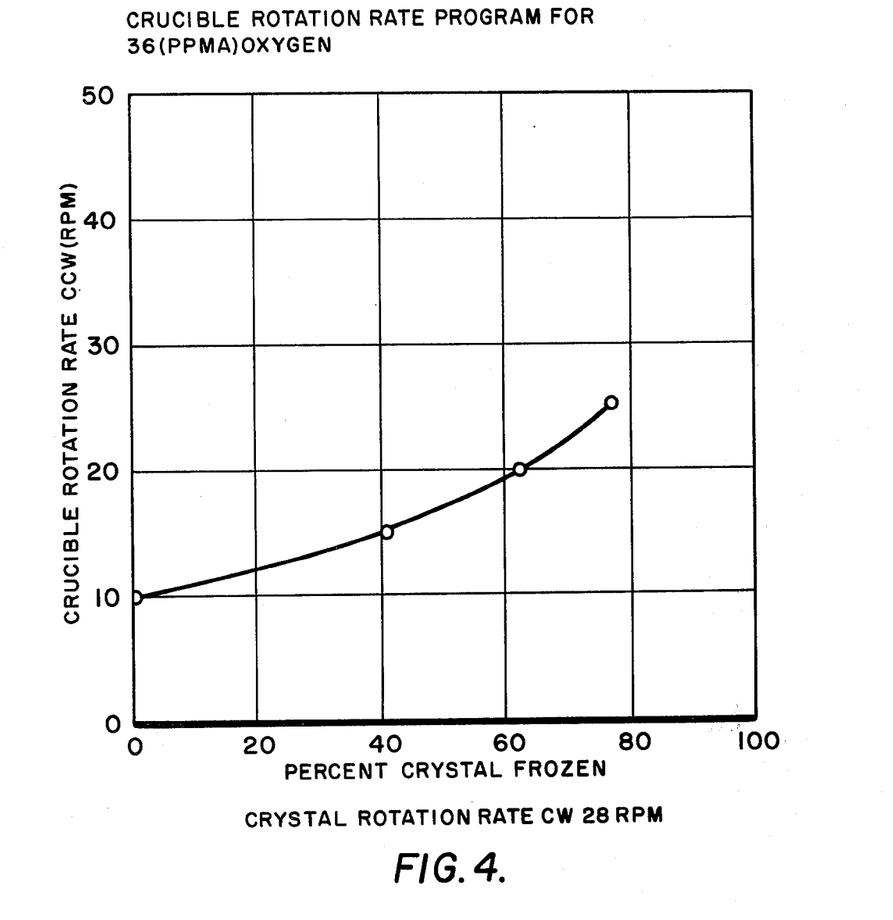

The data of FIG. 3 clearly shows the relationship of oxygen concentration to crucible rotation rate. One simply chooses the correct crucible rotation rate—percent frozen relationship to give a crystal containing a desired oxygen content. For example, if it were desired to grow a crystal containing 36 ppma oxygen we would program the crucible rotation rate as suggested by the dotted line in FIG. 3. Thus, we would start with the crucible rotating at 10 rpm (and the seed at 28 rpm in the opposite direction); we would increase the crucible rotation rate to 15 rpm at 41% frozen, to 20 rpm at 63% frozen and 25 rpm at 78% frozen. The overall program is plotted in FIG. 4. The program in FIG. 4 could be approximated by a number of linear programs that would yield satisfactory results.

Figure 5:
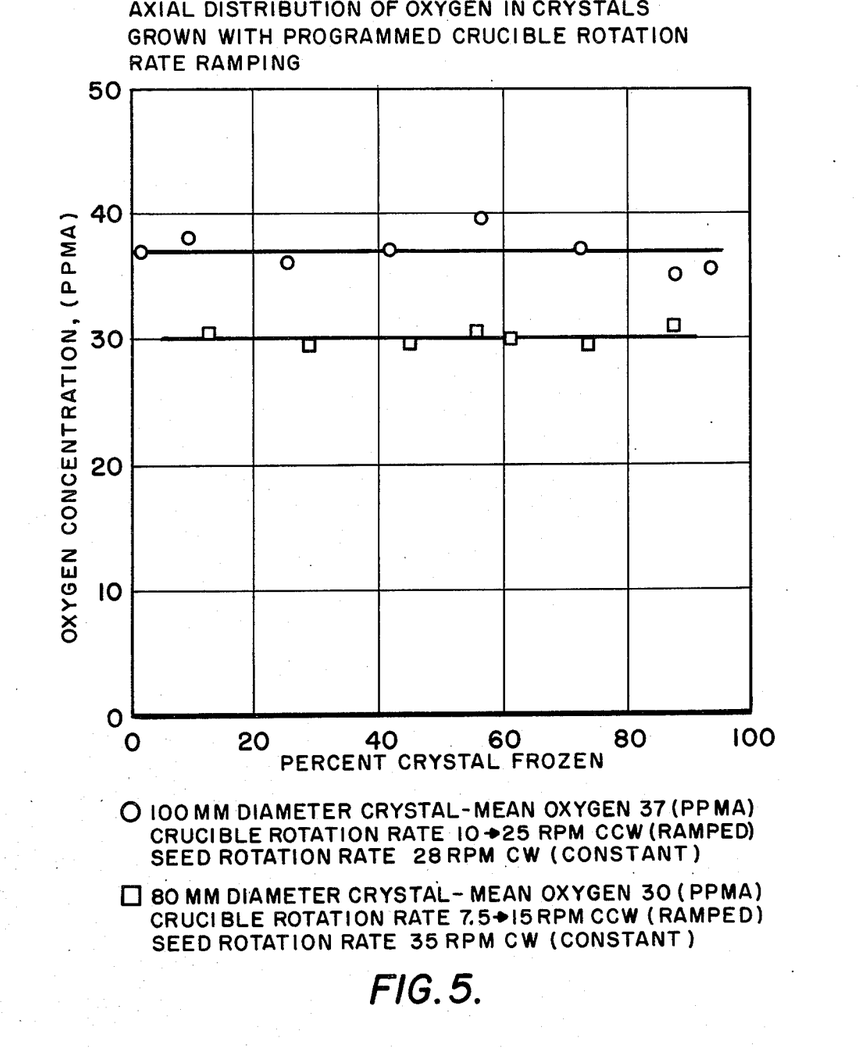

Data similar to that in FIG. 3 can be generated for other crystal diameters and charge sizes. A crucible rotation rate ramping program to produce a desired axial distribution of oxygen can then be deduced. Typical results of the application of the invention is shown in FIG. 5 for crystals of two diameters. The crucible rotation for the 100 mm diameter crystal was ramped (linearly) from 10 rpm at the start of growth to 25 rpm at the tang end of the crystal. The oxygen concentration along the length of the crystal averaged 37 ppma. The 80 mm crystal was grown from a different crucible and charge size. During growth the crucible rotation was increased from 7.5 rpm to 15 rpm. In this case, the axial distribution of oxygen averaged 30 ppma. The improvement in the uniformity of the axial distribution oxygen in these crystals compared with that in a crystal grown under more or less conventional conditions is clearly shown in FIG. 5.

The examples given in FIG. 5 are for illustrative purposes only and are not intended to limit the scope or usefulness of this invention. The method can be used for crystals of any diameter grown from various sized crucibles and starting charges. With the proper application of the method, crystals of predetermined uniform axial distribution of oxygen ranging from about 20 to greater than 40 ppma oxygen can be produced.

Figure 6:
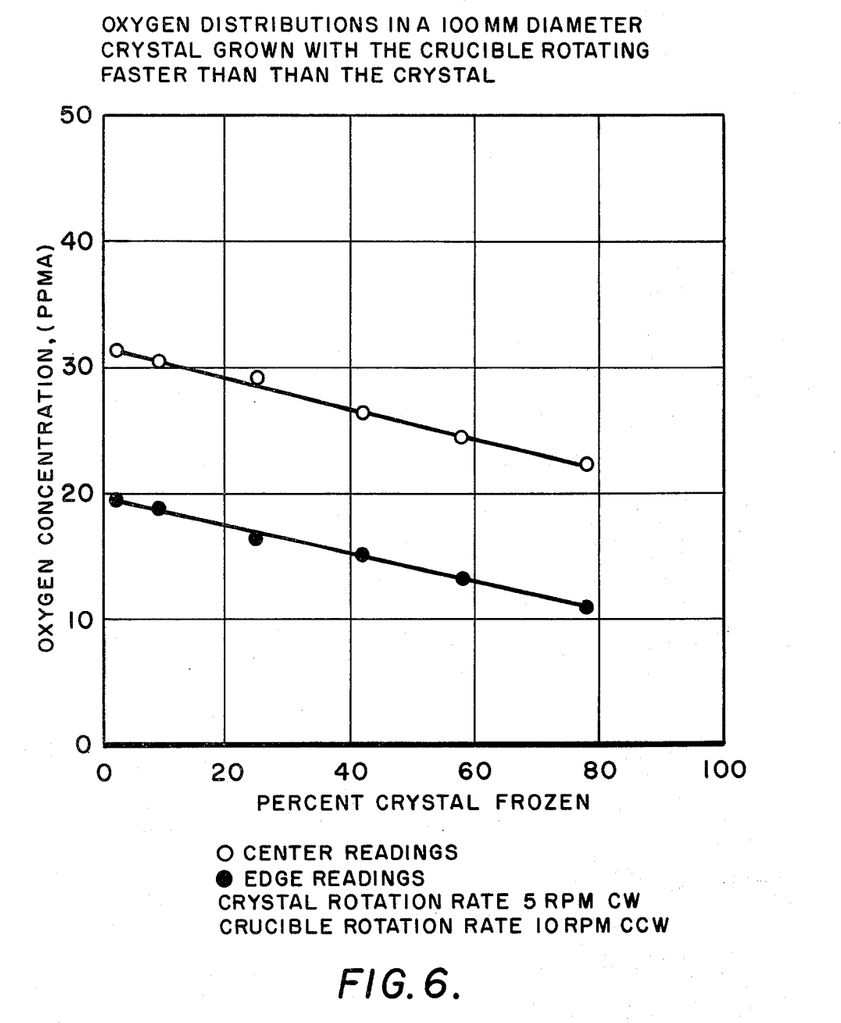
Figure 7:
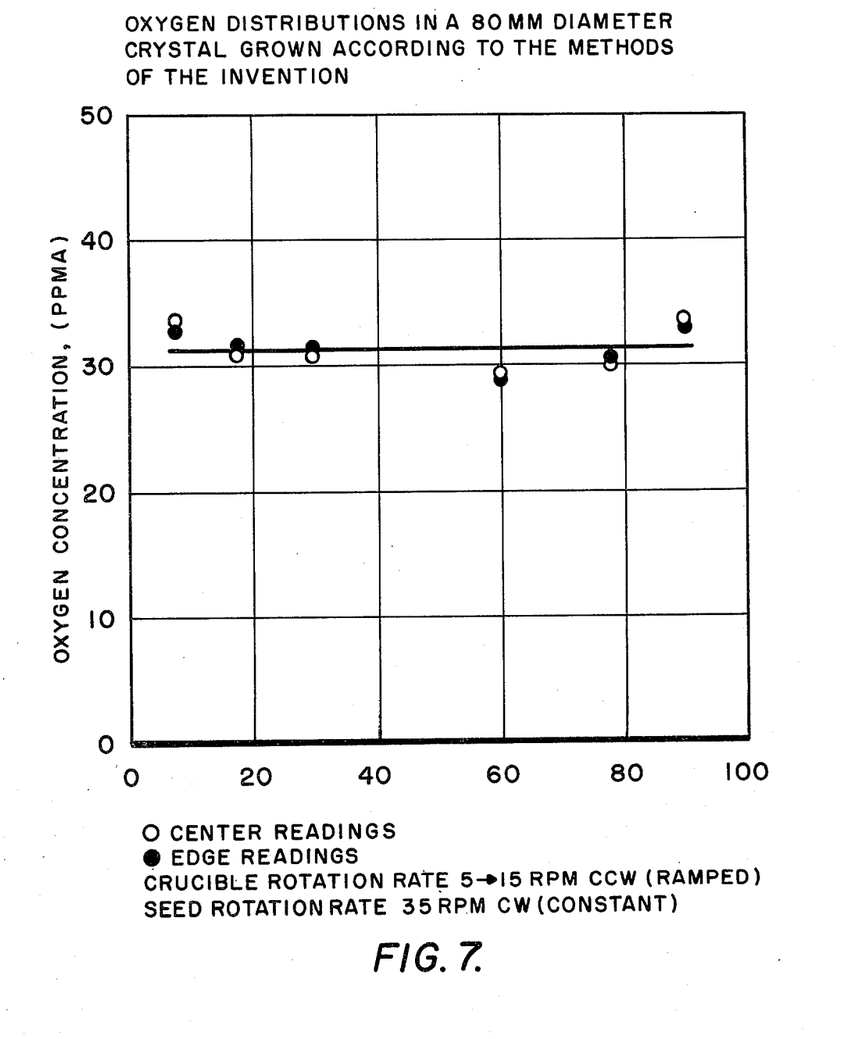

Another feature of this invention is the discovery that uniform radial distribution of oxygen can be insured by rotating the seed counter to the crucible and at a significantly higher rate. The non-uniform radial distribution of oxygen in a crystal grown in the counter rotation mode with the seed rate slightly exceeding the crucible rate was shown in FIG. 1 and was discussed above. The effect of seed rotation on radial uniformity is further illustrated in FIGS. 6 and 7. The distribution of oxygen in a crystal grown in the counter rotation mode with the crucible rotating faster than the seed is shown in FIG. 6. These conditions result in a center-to-edge difference of over 10 ppma over the entire length of the crystal. The oxygen distributions in a 80 mm diameter crystal grown according to the methods of this invention is shown in FIG. 7. In this case the crucible rotation rate is ramped from 5 to 15 rpm and the seed rotation rate is maintained at 35 rpm as the crystal is grown. There is virtually no difference in oxygen concentration across the radius of the crystal. Clearly, seed rotation rates significantly larger than the crucible rotation rate promote radial uniformity. This was found to be true in the counter rotation mode only. It is preferred that the seed rotation exceed the crucible rotation by at least 10 rpm at the seed end of the crystal. The difference may drop to below 5 rpm at the extreme tang end of the crystal.

The information illustrated in FIGS. 1-7 is presented herein to show various results from a variety of art-known methods as compared to the method according to the invention; however, the presentation according to the invention is intended in no way to limit the scope of the invention, but rather to illustrate the advantages achievable by the invention. It should be clear from the presentations of the figures that a silicon crystal with a pre-determined axial and radial uniform oxygen concentration can be grown by selecting initial crystal and crucible rotation rates and then changing the crucible rotation rate at a preselected schedule as the crystal is grown while maintaining the seed rotation rate at a significantly higher value.

The method according to the invention provides Czochralski grown silicon rods which can be utilized substantially throughout the length of the rod since the oxygen gradient is evenly controlled. For example, prior art methods produce Czochralski silicon rods having unacceptable, broad oxygen gradients when comparing the head and tail portions of the rod. Without utilizing the method according to the invention, prior produced Czochralski rods would have high oxygen content at the head of the rod, and low oxygen concentration at the tail or at the end of the rod when the crucible melt level is reduced to a minimum.

The present invention is also concerned in controlling the radial concentration and controlling axial concentration of oxygen throughout the entire length of the Czochralski grown silicon rod. As can be seen from the comparative curves of FIGS. 1 and 6 which are not in accordance with the invention, substantial oxygen gradient exists between the axial curve and the radial curve as well as head to tail phenomena common to prior art systems. In FIGS. 5 and 7 the method according to the invention is utilized in a very positive manner for controlling both the axial and radial oxygen distribution in a Czochralski grown crystal.

While the invention has been particularly shown and described with reference to preferred embodiments thereof, it will be understood by those skilled in the art that the foregoing and other changes in form and detail may be made therein without departing from the spirit and scope of the invention.

We claim:

1. In the Czochralski method for producing silicon rods wherein a single crystal silicon rod is grown by pulling from a silicon melt contained in a crucible and said rod and said crucible are rotated in opposite directions, the improvement to provide both axial and radial uniform distribution of oxygen throughout said rod comprising:
   A. rotating said rod about its axis at a rate greater than the rotation rate of said crucible as said rod is grown, and
   B. increasing the rotation rate of said crucible as the length of said rod increases.

2. The improved method of claim 1 wherein the radial and axial oxygen concentration gradient in said rod is less than about 8 ppma.

3. The improved method of claim 1 wherein the oxygen content of said rod is regulated within the range of from about 15 ppma to about 40 ppma by proper selection of the crucible initial rotation rate and programmed rotation rate increase as the length of said rod increases to maintain the desired oxygen content.

4. The improved method of claim 3 wherein said crucible rotation rate is increased from about 1 to about 40 rpm as said rod is grown.

5. The improved method of claim 1 wherein the axial oxygen concentration gradient is less than about 6 ppma.

6. The improved method of claim 1 wherein the radial oxygen concentration gradient is less than about 5 ppma.

7. The improved method of claim 1 wherein said rod rotation rate is held constant as the rod is grown at a rate greater than the maximum rotation rate of said crucible obtained.

8. The method according to claim 1 wherein said rod rotation rate is increased as said crucible rate of rotation is increased.

* * * * *